United States Patent [19]

Kaja et al.

[11] Patent Number: 5,380,560
[45] Date of Patent: Jan. 10, 1995

[54] PALLADIUM SULFATE SOLUTION FOR THE SELECTIVE SEEDING OF THE METAL INTERCONNECTIONS ON POLYIMIDE DIELECTRICS FOR ELECTROLESS METAL DEPOSITION

[75] Inventors: Suryanarayana Kaja; Shyama P. Mukherjee, both of Hopewell Junction; Eugene J. O'Sullivan, Upper Nyack; Milan Paunovic, Port Washington, all of N.Y.

[73] Assignee: International Business Machines Corporation, Armonk, N.Y.

[21] Appl. No.: 921,186

[22] Filed: Jul. 28, 1992

[51] Int. Cl.$^6$ .......................................... C23C 26/00
[52] U.S. Cl. ................... 427/306; 427/304; 427/305; 427/437; 427/438; 427/443.1
[58] Field of Search ............... 427/304, 306, 437, 305, 427/438, 443.1

[56] References Cited

U.S. PATENT DOCUMENTS

| | | | |
|---|---|---|---|
| 4,078,096 | 3/1978 | Redmond et al. | 427/98 |
| 4,182,784 | 1/1980 | Krulik | 427/304 |
| 4,261,800 | 4/1981 | Beckenbaugh et al. | 427/98 |
| 4,262,085 | 4/1981 | Ehrich et al. | 427/306 |
| 4,411,743 | 10/1983 | Kreuter et al. | 204/47 |
| 4,424,241 | 1/1984 | Abys | 427/443.1 |
| 4,517,254 | 5/1985 | Grapentin et al. | 428/626 |
| 4,701,351 | 10/1987 | Jackson | 427/305 |
| 4,770,899 | 9/1988 | Zeller | 427/306 |
| 4,804,410 | 2/1989 | Haga | 427/304 |
| 4,966,786 | 10/1990 | Ehrich et al. | 427/97 |
| 4,986,848 | 1/1991 | Yamamoto et al. | 106/1.11 |
| 5,167,992 | 12/1992 | Lin | 427/306 |

OTHER PUBLICATIONS

"Polyimide/Metal Interface of Microelectronic Devices"; J. Kim et al; IBM T. J. Watson Research Center; pp. 1-3.

Primary Examiner—Shrive Beck
Assistant Examiner—Vi Duong Dang
Attorney, Agent, or Firm—Whitham, Curtis, Whitham & McGinn

[57] ABSTRACT

A method of selectively seeding or activating metal interconnections patterned on polyimide dielectric surfaces using an aqueous solution of palladium sulfate, palladium perchlorate, palladium trifluoromethane sulfonate, palladium nitrate or other palladium salts having poorly coordinating counter ions. This strongly selective seeding and the corresponding ability to reliably remove all traces of the seeding material from the polyimide surface eliminates shorting, bridging and reduction of breakdown voltage during electroless plating of a thin layer of nickel or cobalt.

20 Claims, 2 Drawing Sheets

PALLADIUM SULFATE SOLUTION FOR THE SELECTIVE SEEDING OF THE METAL INTERCONNECTIONS ON POLYIMIDE DIELECTRICS FOR ELECTROLESS METAL DEPOSITION

BACKGROUND OF THE INVENTION

1. Field of the Invention

The present invention is generally related to selective seeding or activation of metal interconnections patterned on polyimide dielectric surfaces for the electroless deposition of metal and, more particularly, to the elimination of bridging or shorting during electroless plating of a thin layer of nickel or cobalt or other metals or alloys on patterned metal interconnections on polyimide dielectric layers.

2. Description of the Prior Art

Electroless metal deposition involves generating a pattern of a suitable catalyst on a substrate and then depositing metal on that pattern. In a typical electroless plating process, an insulating layer of a non-conductive material such as a polyimide is coated on a substrate, followed by the application of a layer of photoresist. The photoresist is then exposed to a radiation source to generate a pattern. After exposure, the photoresist is developed using conventional methods. Metal, usually copper (Cu), is then deposited in the patterned areas to form metal interconnections. The structure is then immersed in an activating solution which contains a catalyst. The catalyst is generally a colloidal solution containing a noble metal such as palladium, which acts as a seed to promote the deposition of further metal on the metal pattern.

The most commonly used activating solutions are palladium acetate or a palladium salt or palladium sol from palladium chloride and stannous chloride. The immersion usually lasts five to fifteen seconds and is performed at room temperature. During the immersion, the surfaces of the metal interconnections are activated, which means that they will readily plate when immersed in an electroless plating solution. The activating metal-reduced surface is then subjected to an electroless metal deposition bath, which is catalyzed by the reduced activating metal, and an electroless metal deposit is obtained on the metal interconnection surfaces. The metal deposit is typically nickel (Ni) or cobalt (Co) or alloys of nickel or cobalt and serves to protect the metal interconnections from oxidation.

The most important functional requirement of the seeding process is to have minimum chemical interactions between the non-conductive substrate or resist surface and the activating metal ions. Any residual metal ions or metallic colloidal particles on this surface could act as a seed for metal deposition on that surface as well as on the seeded metal in the electroless bath. Any such metal contamination and deposition on this insulating surface is deleterious to the electrical performance of the dielectric layers due to shorting, bridging or reduction of breakdown voltage which may be caused.

For example, U.S. Pat. No. 4,262,085 discloses a process for preparing metal patterns on insulating carrier materials in which undesired metal deposition is eliminated. The method involves applying a photosensitizer to the carrier and exposing the carrier to a radiation source to form a pattern. Metal seeds formed on the surface of the carrier are augmented with an aqueous palladium-salt solution, followed by the deposition of a Ni layer. The Ni layer is then treated with a solution containing a complex forming agent for Cu ions. A Cu layer is deposited by means of a currentless coppering bath.

In recent years, polyimide materials have become of substantial interest in the area of electrical component fabrication and for microelectronic components, in particular. Such materials exhibit a desirable combination of high temperature stability and low dielectric constant properties to a unique degree. Further, such materials are easily worked and exhibit a high degree of adhesion with metal layers deposited thereon by, for example, vapor deposition. Polyimide can also be deposited on metal, as well, and can be sensitized to function as a permanent resist. Once cured, the desirable properties of the polyimide are retained and a resist layer can be left as a permanent part of the device structure. In devices which include a polyimide substrate, layer or resist, copper is often the metal of choice for forming conductive patterns as described above.

However, while polyimide materials are extremely desirable, the properties which allow improved adhesion with metals appear to cause a high degree of unintended activation or seeding of the polyimide surface with consequent metal deposition during electroless metal deposition processes. This unwanted activation or seeding decreases manufacturing yields of fabrication processes and reduces performance of components as described above.

As an example of prior attempts to achieve electroless plating of copper deposited on polyimide without seeding of the polyimide, U.S. Pat. No. 4,770,899, to Zeller teaches activation of both the copper and the polyimide with palladium chloride followed by selective deactivation of the polyimide surface with a sodium hydroxide solution. However, the combination of general activation and selective deactivation requires additional process steps and introduces additional process variables. It has also been found that this technique is not optimally effective for the avoidance of seeding and the formation of shorts between conductors in extremely fine patterns. Further, as will be discussed in greater detail below, the presence of chloride ions tends to increase the susceptibility of the copper to corrosion to a degree sufficient to reduce manufacturing yields and product reliability. This corrosive effect of palladium chloride as a seeding solution has particularly severe consequences in electronic devices having extremely fine conductor patterns.

SUMMARY OF THE INVENTION

It is therefore an object of the present invention to provide a surface activation or seeding technique which is strongly selective between metal and polyimide surfaces.

It is another object of the present invention to provide a method of eliminating bridging or shorting between portions of a connection pattern during electroless plating thereof.

It is a further object of the present invention to provide an activating solution for electroless plating in which the activating metal ions can be preferentially and easily removed from the substrate by simple rinsing with water and/or with a dilute complexing solution before metal deposition.

In accordance with one aspect of the invention, a method is provided including the steps of cleaning metal embedded in a polyimide surface; seeding the metal using an activating solution comprising a palladium salt having poorly coordinating counter ions palladium salt; removing palladium ions from the polyimide dielectric; and plating a metal on the metal embedded in the polyimide surface.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
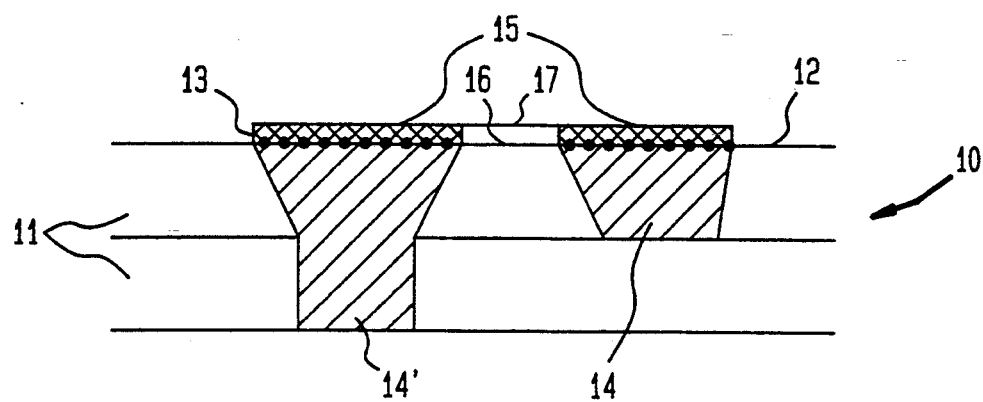
FIG. 1 shows a simple structure to which the invention may be applied.

Referring now to the drawings, and more particularly to FIG. 1, there is shown a simple structure 10 to which the invention may be applied. This structure, as a minimum includes a body of polyimide material 11 in which a body 14 of conductive material such as copper is embedded such that the surface 12 of the polyimide body. 11 is generally coplanar with the surface 13 of the body of conductive material 14. Alternatively, the body of conductive material could protrude from the polyimide body or be deposited on the surface thereof. The use of copper in this structure 10, however, often requires a further metal coating shown by line 15 on surface 13 to protect the copper body 14 structurally and chemically. The invention is directed to an improved technique of providing coating 15 by an electroless process which provides for strongly selective seeding of surface 13 without seeding of surface 12. As pointed out above, if seeding of surface 12 were to occur at, for example, location 16, electroplating of the polyimide surface would occur and might bridge between conductors 14 and 14' as shown by line 17.

Figure 2:
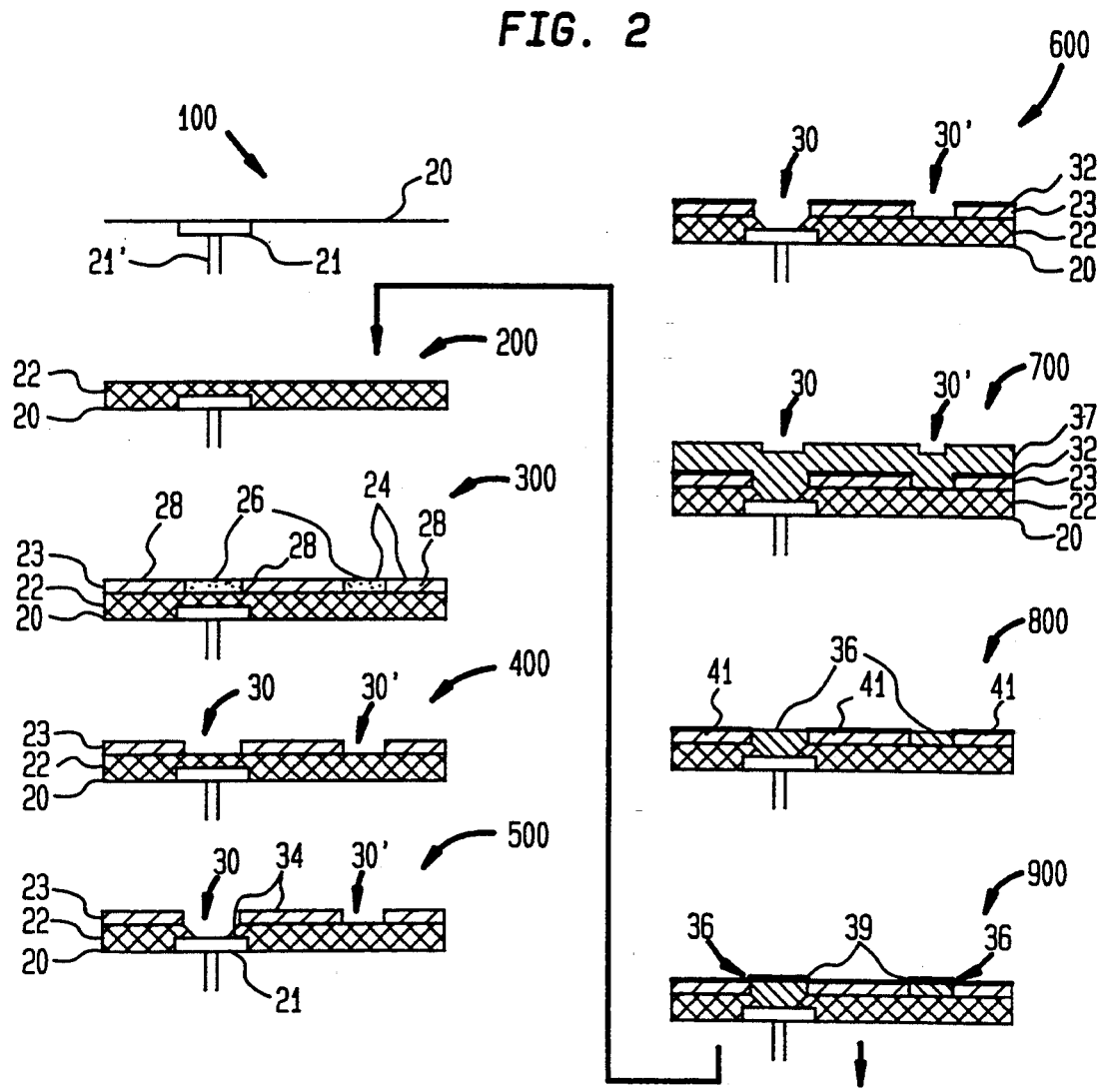
FIG. 2 shows a cross-sectional side view of a multilayer interconnect building process to which the present invention is applied.

Referring now to FIG. 2, a process for strongly selective seeding in accordance with the invention is shown. The sequence of constructions of the exemplary structure shown in cross-section are designated by reference numerals 100, 200, . . . 900 (e.g. integral multiples of 100). For succeeding layers, the entire process can be repeated at will as indicated by arrow 1000.

The beginning point of the process, illustrated by assembly 100, requires nothing more than a surface 20. The substrate or layer including surface 20 may be comprised of any semiconductor material such as silicon or germanium or a non-semiconductor material, such as ceramic or glass. This surface could include one or more conductive surfaces, as indicated at 21, which may be connected to underlying connection structures such as vias, depicted at 21'. A blanket layer of chromium (Cr) or Cr/Cu may be first applied to surface 20, or a portion thereof, for adhesion. As shown at assembly 200, a layer of a polyimide 22, such as meta-paete (an acronym for Meta-PolyAmic acid EThyl Ester which is commercially available through DuPont) is then applied to planarize the surface of the substrate 20. A layer of a photosensitive polyimide or resist 23, such as Ciba-Geigy 412, is coated over the polyimide 22 and then patterned, as shown at assembly 300, in a conventional fashion by applying a mask (not shown) over the polyimide 22 and exposing the structure 24 to a radiation source. If the photosensitive polyimide 23 is positive tone, as shown in FIG. 2, the exposed areas 26 become soluble and may be removed with a chemical etchant. In the case of a negative tone, the exposed areas 26 become crosslinked, thus allowing the removal of the unexposed areas 28. The pattern is then developed, as depicted in assembly 400, to form trenches 30 having dimensions of approximately 20 $\mu m \times 8 \mu m$ in a preferred embodiment of the invention, but these dimensions are not important to the practice of the invention.

As shown at assembly 500, further etching of polyimide layer 22 is done at 30, preferably through the same mask formed by the developed polyimide layer, to reach an underlying conductor 21. However, further selectivity of etched areas could be provided by techniques well-understood in the art, such as a further mask, to avoid etching of some areas such as that indicated at 30'.

A conductive layer of Cr/Cu 32 is then applied to the surface 34 to provide an electrically conductive layer for metal deposition, as shown at assembly 600. Finally, as shown at assembly 700, a blanket layer of copper (Cu) 37 is deposited on the structure to completely fill the trenches 30. The top surface of the structure is planarized to remove Cu from areas above the trenches 30. The Cu interconnections 36 are then cleaned with 10% sulfuric acid for approximately one minute at room temperature followed by rinsing with deionized (DI) water for 30 seconds.

At this point in the process, the seeding for providing a passivating cap for the copper connection pattern is performed. Copper is relatively reactive with ambient gases and other contaminants, requiring the use of a passivating layer of nickel or cobalt, as described above. However, it has been found that certain difficulties are presented by the combination of copper conductors on polyimide. Specifically, the presence of chloride ions in many activating solutions is undesirable because it enhances the corrosion potential of the copper interconnections. Activation or seeding solutions otherwise preferred in the art, as described above, cannot be used since the subsequent corrosion of copper due to residual chloride is too severe to allow production of reliable product at high yields. Other metals suitable for forming connection patterns may also exhibit this problem to a lesser degree. Further, even if gold were to be used for the connection pattern, the commonly used activation materials described above cause seeding of the polyimide surface which can cause deposition of metal on the polyimide insulator.

To overcome these difficulties in accordance with a preferred embodiment of the invention, the structure is then seeded by dipping it in an aqueous sulfuric acid solution of palladium sulfate ($PdSO_4$), as shown at assembly 800. According to the invention, palladium sulfate, palladium nitrate, palladium perchlorate palladium triflouromethane sulfonate, palladium fluoroborate, all of which have poorly coordinating counter ions that do not form complexes are used in selectively seeding or activating metal surfaces 36. While not wishing to be held to any particular theory accounting for the unexpectedly improved preferential seeding of metal surfaces through the use of such materials, it is believed that palladium salts yielding strongly coordinating ions and ligands and having less positive redox potentials are harder to deposit thermodynamically and kinetically. Consequently, side reactions such as adhesion to polyimide are encouraged.

A prime example is palladium chloride ($PdCl_2$) which complexes to [$PdCl_4^{-2}$ and has a redox potential of 0.62 v. The chloride ion is a strongly coordinating ion and is thus expected to complex. Other strongly coordinating ions are $CN^-$, $SCN^-$ and chelating agents such as ethylene diamine.

As another example, sodium acrylate, when treated with palladium sulfate solution causes the exchange of $Pd^{+2}$ with $Na^+$ and thus a palladium nucleus is formed on he acrylate modified surface. By comparison, palladium acetate solution, because of its weak electrolytic nature, tends to interact with the polyimide surface and becomes difficult to remove by a simple water rinse. Moreover, even after rinsing palladium acetate with ethylene diamine tetracetic acid (EDTA), which is a strong complexing agent for palladium ions, the removal of palladium-seed is not complete and, as a result, seeding of the polyimide surface is unavoidable.

On the other hand and in accordance with the present invention, it is believed that palladium salts having poorly coordinating counter ions are easier substances with which to seed and have fewer side reactions. An example is the preferred $PdSO_4$ of the present invention, noted above. In this case, the palladium ions are not strongly complexed and, consequently, $PdSO_4$ aqueous solution has been found to be effective in selectively depositing palladium onto metal surfaces 36. The redox potential thus becomes that of $Pd^{+2} + 2e \rightarrow Pd^0$ or 0.987 v. Other poorly coordinating ions besides $SO_4^{-2}$ are $NO_3^-$, $ClO_4^-$, $CF_3SO_3^-$ (e.g. palladium trifluoromethane sulfonate) and $BF_4^{31}$. Therefore, it is believed that Pd salts containing the $NO_3^-$, $ClO_4^-$, $CF_3SO_3^-$ and $BF_4^-$ ions will also be effective for the practice of the invention. Thus, seeding of a polyimide surface can be avoided by using these solutions in conjunction with conventional electroless plating process techniques, thereby preventing the tendency for bridging or shorting. Palladium ions in the solutions are easily rinsed from the polyimide surface with water or a dilute aqueous solution of a complexing agent. The palladium sulfate, nitrate or salt solutions may be used in the capping of the metal interconnections embedded in polyimide dielectric layers and for the encapsulation of bottom side metallurgy (BSM) pads with a Ni or Co coating.

Preferably in the practice of the invention, the concentration of $PdSO_4$ ranges from 0.01 to 1.0 gram/liter (g/l) in a solution having a 2–15% by volume sulfuric acid concentration. Alternatively, a solution of palladium perchlorate, palladium nitrate, palladium trifluoromethane sulfonate or other palladium salt solution having poorly coordinating counter ions may be utilized.

Seeding time ranges from 0.5 to 15 minutes at temperature of 25° C. The preferred $PdSO_4$ or other palladium salt having poorly coordinating counter ions activates the Cu interconnections 36 and is removed from the polyimide surface by rinsing with water or a sodium citrate complexant having a concentration of 5–30 g/l of sodium citrate at a temperature of 25° C. for 1–10 minutes. The additional rinse with a complexing agent is utilized to ensure a complete removal of the last traces of palladium, particularly within the narrow spacings between interconnections which may be as small as 5 $\mu$m. If palladium is not removed, the polyimide surfaces 41 will plate along with the surfaces of the Cu interconnections 36. After complexant rinsing, and a DI water rinse, a thin electroless layer 39 of Ni or Co is plated on the metal interconnections 36. Generally, Cu is utilized for the metal interconnections 36 and Co is the preferred electroless plating metal because it does not diffuse into Cu. Plating is performed at a temperature of approximately 50° C. −90° C. and pH of 4.5 to 10 for a time period of 2–45 minutes. The plating step is followed by a DI water rinse. The resulting structure 900 is dried in nitrogen.

Figure 3:
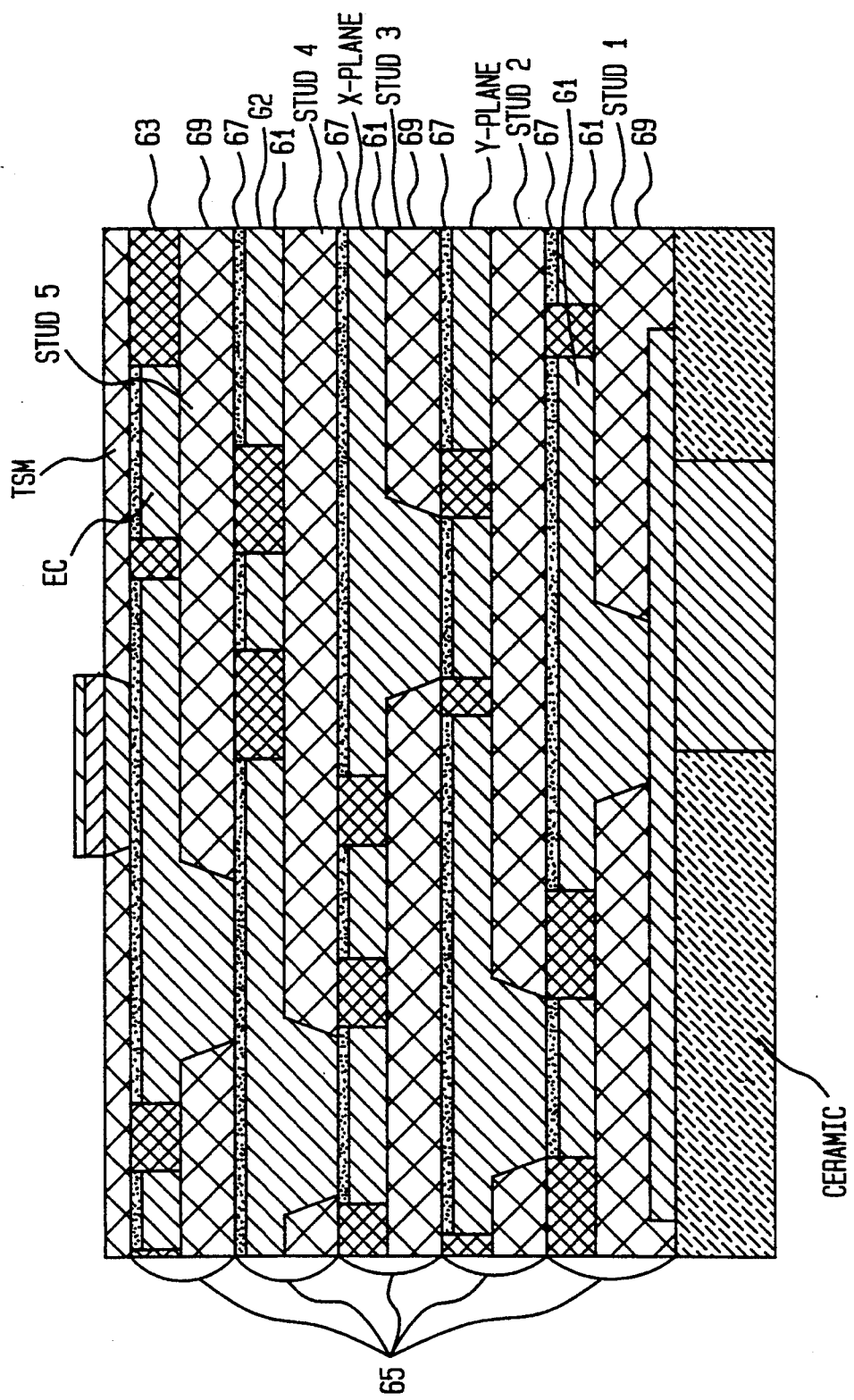
FIG. 3 shows a cross-sectional side view of a multilayer structure having layers of Ni or Co separating copper interconnections within various layers of polyimide.

FIG. 3 shows a multilayer structure having layers of Cu interconnections 61 embedded in polyimide 63. The structure is formed by repeating the process shown in FIG. 2 to form sequential polyimide dielectric layers 65. Thin electroless Co or Ni caps 67 act as diffusion barriers between the Cu interconnections 61 and each layer of polyimide containing other Cu interconnections 61. The caps 67 also prevent corrosion, promote adhesion and prevent interaction between polyamic acid and copper of the interconnections 61, promote adhesion between polyimide layers 65 and do not deteriorate the polyimide dielectric properties.

The inventors believe that palladium sulfate, palladium perchlorate, palladium trifluoromethane sulfonate, palladium nitrate or palladium fluoroborate, all of which have poorly coordinating counter ions is most suitable in selectively seeding or activating the metal interconnections with minimum interactions with the polyimide surface. Palladium-acetate differs from palladium-sulfate and other palladium salts having poorly coordinating counter ions in that the former tends to form polynuclear hydroxylated large molecular clusters in water which become reactive to polymer surfaces through strong hydrogen or chemical bonding. Similarly, palladium chloride hydrolyzes in solution to form hydroxylated palladium ions, also in a polymeric form which interacts with non-interconnect regions to form clusters. Removal of these molecular clusters is difficult using a simple rinsing procedure. In addition, the clusters can easily act as a seed for metal deposition because of the large size as compared to a single palladium ion.

As an example of the process in accordance with the invention, a structure such as that shown at 10 in FIG. 1 is rinsed in deionized (DI) water and cleaned with a solution of 1%–10% sulfuric acid or other etching solution for 1–5 minutes at 25° C.–75° C. Then the DI water rinse is repeated. Following the second rinse, the structure is immersed in a seeding solution of 0.01–1 gram/liter of palladium sulfate or other palladium salts with poorly coordinating counter ions and containing 1%–20% sulfuric acid at 25° C.–75° C. for 1 to 5 minutes. The structure is again rinsed in DI water, as above, and then subjected to a complexing rinse containing 10–50 grams/liter of sodium citrate at 25° C.–75° C. for 1 to 5 minutes and again rinsed in DI water as above. The selectively activated surface of the copper can now be plated with nickel or cobalt or other desired material by known electroless processes without deposition of metal on the polyimide surface.

While the invention has been described in terms of several preferred embodiments which can be used singly or in combination, those skilled in the art will recognize that the invention can be practiced with modification within the spirit and scope of the appended claims.

In particular, it is to be understood that the invention is applicable to the electroless plating of any metal or alloy on any metal or alloy in the presence of polyimide and produces highly selective seeding of the metal without seeding of the polyimide.

Having thus described our invention, what we claim as new and desire to secure by Letters Patent is as follows:

1. A method of selectively seeding a surface of a metal or alloy at a polyimide surface for electroless deposition of a further metal comprising the steps of:

seeding said surface of said metal using an activating solution selected from the consisting of palladium sulfate, palladium perchlorate, palladium trifluoromethane sulfonate, palladium nitrate, and palladium fluoroborate;

removing palladium ions from said polyimide by rinsing said polyimide with a rinse selected from the group consisting of water and sodium citrate complexant; and plating said further metal or alloy on said metal.

2. A method as recited in claim 1 wherein said step of plating is performed using nickel or cobalt which can be electrolessly deposited.

3. A method as recited in claim 1 wherein said step of seeding is performed using an activating solution comprising 0.01 to 1.0 gram/liter palladium sulfate in 2-15 percent by volume sulfuric acid.

4. A method as recited in claim 1 wherein said step of plating is performed at a temperature in the range of 50° C. to 90° C. and pH in the range of 7 to 10 for a time period of 5-45 minutes.

5. A method as recited in claim 1 including the further step of
cleaning said surface of said metal and said polyimide surface.

6. A method as recited in claim 5 wherein said step of cleaning is performed using 10% sulfuric acid.

7. The method of claim 1 wherein said step of seeding is performed with an activating solution selected from the group consisting of palladium perchlorate, palladium trifluoromethane sulfonate, palladium nitrate, and palladium fluoroborate.

8. A method of electroless plating comprising the sequential steps of:

applying a blanket layer of chromium-copper to a substrate;

applying a polyimide underlayer on said layer of chromium-copper;

applying an overlayer of polyimide on said polyimide underlayer;

patterning said overlayer of polyimide so as to form trenches in said overlayer and in said polyimide underlayer applying a blanket layer of chromium or chromium-copper;

depositing a blanket layer of metal, whereby said trenches are completely filled;

planarizing said blanket layer of metal, whereby metal is removed from areas above said patterned polyimide overlayer outside said trenches;

seeding remaining metal using an activating solution comprising a palladium salt having poorly coordinating counter ions;

removing palladium ions from said polyimide overlayer;

plating nickel or cobalt on said remaining metal by electroless deposition.

9. A method as recited in claim 8 wherein said step of removing is performed by rinsing said polyimide using a sodium citrate complexant.

10. A method as recited in claim 8 wherein said step of removing is performed by rinsing said polyimide using deionized water.

11. A method as recited in claim 8 wherein said step of depositing is performed using a blanket layer of copper.

12. A method as recited in claim 8 wherein said step of seeding is performed using an activating solution comprising 0.01 to 1.0 gram/liter palladium sulfate in 2-15 percent by volume sulfuric acid.

13. A method as recited in claim 8 wherein said step of plating is performed at a temperature in the range of 50° C. to 90° C. and pH in the range of 4.5 to 10 for a time period of 2-45 minutes.

14. A method as recited in claim 8 wherein said palladium salt includes palladium sulfate, palladium perchlorate, palladium trifluoromethane sulfonate or palladium nitrate.

15. A method as recited in claim 8 wherein said step of plating is performed at a temperature of 75° C. and pH of 8.0 for a time period of 2-15 minutes.

16. A method as recited in claim 8 including the further step of
cleaning said remaining metal interconnections with sulfuric acid.

17. A method as recited in claim 16 wherein said step of cleaning is performed using 10% sulfuric acid.

18. A method as recited in claim 8 wherein said overlayer of polyimide is photosensitive and said patterning step includes the further steps of
exposing said photosensitive polyimide overlayer to a radiation source to form a pattern; and
developing said photosensitive polyimide overlayer to form trenches in said photosensitive polyimide overlayer and in said polyimide underlayer, 19. A method as recited in claim 8, wherein said palladium salt, in said activating solution, provides counter ions which are coordinating to a degree similar to the coordinating exhibited by the group of ions consisting of $SO_4^-$, $NO_3^-$, $CF_3SO_4^-$, and $BF_4^-$.

20. A method as recited in claim 8, wherein said counter ions of said palladium salt do not form complexes or significantly react with said polyimide surface.

* * * * *